(12) United States Patent
Lee

(10) Patent No.: US 7,494,889 B2
(45) Date of Patent: Feb. 24, 2009

(54) METHOD OF MANUFACTURING AN INTERPOSER INCLUDING AT LEAST ONE PASSIVE ELEMENT AT LEAST PARTIALLY DEFINED BY A RECESS THEREIN

(75) Inventor: Teck Kheng Lee, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/923,437

(22) Filed: Aug. 19, 2004

(65) Prior Publication Data

US 2006/0024900 A1 Feb. 2, 2006

(30) Foreign Application Priority Data

Jul. 29, 2004 (SG) ............................. 200404289-1

(51) Int. Cl.
*H01L 21/20* (2006.01)
(52) U.S. Cl. .................. 438/381; 438/238; 438/329
(58) Field of Classification Search ................ None
See application file for complete search history.

(56) References Cited

U.S. PATENT DOCUMENTS

| | | | |
|---|---|---|---|
| 3,530,573 A | 9/1970 | Helgeland |
| 4,097,988 A | 7/1978 | Hauschild |
| 4,508,753 A | 4/1985 | Stepan |
| 4,508,754 A | 4/1985 | Stepan |
| 4,630,025 A | 12/1986 | Bourolleau |
| 4,670,734 A | 6/1987 | Caddock |
| 4,681,656 A | 7/1987 | Byrum |
| 4,796,356 A | 1/1989 | Ozaki |
| 4,912,844 A | 4/1990 | Parker |
| 5,116,641 A | 5/1992 | Patel et al. |
| 5,119,538 A | 6/1992 | White et al. |

(Continued)

FOREIGN PATENT DOCUMENTS

EP 0 536 895 A1 4/1993

OTHER PUBLICATIONS

Universal Instruments Corporation, Chip Scale Package Technology Wafer Scale Package Issues, Jul. 17, 2000, 11 pages.

(Continued)

*Primary Examiner*—Zandra Smith
*Assistant Examiner*—Khanh B Duong
(74) *Attorney, Agent, or Firm*—TraskBritt

(57) ABSTRACT

An interposer for assembly with a semiconductor die and methods of manufacture are disclosed. The interposer may include at least one passive element at least partially defined by at least one recess formed in at least one dielectric layer of the interposer. The at least one recess may have dimensions selected for forming the passive element with an intended magnitude of at least one electrical property. At least one recess may be formed by removing at least a portion of at least one dielectric layer of an interposer. The at least one recess may be at least partially filled with a conductive material. For instance, moving, by way of squeegee, or injection of a conductive material at least partially within the at least one recess, is disclosed. Optionally, vibration of the conductive material may be employed. A wafer-scale interposer and a system including at least one interposer are disclosed.

30 Claims, 11 Drawing Sheets

U.S. PATENT DOCUMENTS

| | | | |
|---|---|---|---|
| 5,466,963 A | 11/1995 | Beasom | |
| 5,680,814 A | 10/1997 | Lautzenhiser et al. | |
| 5,716,663 A | 2/1998 | Capote et al. | |
| 5,770,476 A * | 6/1998 | Stone | 438/106 |
| 5,973,391 A * | 10/1999 | Bischoff et al. | 257/678 |
| 5,994,997 A | 11/1999 | Brown et al. | |
| 6,135,024 A * | 10/2000 | Higashida et al. | 101/123 |
| 6,171,921 B1 | 1/2001 | Dunn et al. | |
| 6,200,400 B1 * | 3/2001 | Farooq et al. | 156/89.16 |
| 6,200,405 B1 | 3/2001 | Nakazawa et al. | |
| 6,229,098 B1 | 5/2001 | Dunn et al. | |
| 6,256,866 B1 | 7/2001 | Dunn | |
| 6,274,937 B1 * | 8/2001 | Ahn et al. | 257/777 |
| 6,288,627 B1 | 9/2001 | Ulmer | |
| 6,418,032 B2 * | 7/2002 | Hirata et al. | 361/780 |
| 6,424,034 B1 * | 7/2002 | Ahn et al. | 257/723 |
| 6,505,553 B2 * | 1/2003 | Ishida et al. | 101/129 |
| 6,534,341 B2 | 3/2003 | Farnworth | |
| 6,539,613 B1 | 4/2003 | Ulmer | |
| 6,556,453 B2 * | 4/2003 | Figueroa et al. | 361/763 |
| 6,653,208 B2 | 11/2003 | Ahn et al. | |
| 6,858,892 B2 | 2/2005 | Yamagata | |
| 6,875,921 B1 * | 4/2005 | Conn | 174/52.4 |
| 6,891,248 B2 * | 5/2005 | Akram et al. | 257/532 |
| 6,938,332 B2 * | 9/2005 | Harada et al. | 29/830 |
| 7,220,667 B2 | 5/2007 | Yamagata | |
| 2003/0108664 A1 | 6/2003 | Kodas et al. | |
| 2004/0033654 A1 | 2/2004 | Yamagata | |
| 2004/0184219 A1 | 9/2004 | Otsuka et al. | |

OTHER PUBLICATIONS

Hunt, D., et al., Screen Printing Technical Foundation (SPTF), "A Guidline to Wet and Dry Ink Deposit Measurement Methods, Part Three of Three," 1996, pp. 1-13.

Dunn, G., et al., "Improvements in Polymer Thick Film (PTF) Resistor Technology," http://www.circuitree.com, Jul. 1, 2003, pp. 1-10.

Savic, J., et al., "Embedded Passives Technology Implementation in RF Applications," http://www.boardauthority.com, Jun. 1, 2002, pp. 1-12.

Ohmega Technologies, Inc., Ohmega-Ply Presentation. Oct. 2003, pp. 1-30.

* cited by examiner

METHOD OF MANUFACTURING AN INTERPOSER INCLUDING AT LEAST ONE PASSIVE ELEMENT AT LEAST PARTIALLY DEFINED BY A RECESS THEREIN

BACKGROUND OF THE INVENTION

1. Field of the Invention

The present invention relates to semiconductor devices and components. Particularly, the present invention relates to forming passive elements, such as inductors, resistors, and capacitors, wherein the passive elements have relatively precise electrical properties.

2. Background of Related Art

Conventional screen-printed resistors, which may be termed "thick-film" resistors, are employed in hybrid electronic circuits to provide a wide range of electrical resistance values. Conventional screen-printing processes are used to deposit conductive paste or ink upon a surface of a substrate, such as a substrate comprising FR-4, flexible circuit, ceramic, or silicon. Screen-printing pastes used with ceramic printed wire boards may typically include a glass frit composition, an electrically conductive material, various additives for favorably affecting the electrical properties of the resistor, and an organic vehicle or polymer matrix material. Screen-printing pastes used in organic printed wire board construction typically include an electrically conductive material, various additives for favorably affecting the electrical properties of the resistor, an organic binder, and an organic vehicle. After printing, the screen-printing paste may be typically heated to dry the paste and convert the paste into a suitable film that adheres to the substrate. If a polymer screen-printing paste is used, the heating step may remove the organic vehicle and cure the polymer matrix material. Other screen-printing pastes may be preferably sintered, or fired, during which the paste is heated to burn off the organic vehicle and fuse the remaining solid material.

The electrical resistance of a screen-printed resistor may be dependent, at least partially, on the precision with which the dimensions of the resistor are produced, the stability of the resistor material, and the stability of the resistor terminations. Accuracy in forming of at least one dimension (e.g., a width, length or thickness) of a screen-printed resistor may be particularly challenging in view of the conventional techniques employed, as well as the dimensional instability that may occur during subsequent processing.

Initially, for rectangular screen-printed resistors, the width and thickness are determined by the screen-printing process, and the length is determined by the termination pattern. More particularly, conventional screen-printing techniques generally employ a template with apertures bearing the positive image of the resistor to be created. The template, referred to as a mask or stencil, may be placed proximate to and above the surface of the substrate on which the resistor is to be formed. The stencil may then be loaded with the conductive paste, and a so-called squeegee blade may be drawn across the surface of the mask, pressing the paste through the apertures of the stencil and onto the surface of the substrate.

However, even if the dimensions of a conventional screen-printed passive element are reasonably well controlled upon initially depositing the paste upon the surface of a substrate, the control of dimensions may be influenced by dimensional changes that occur after deposition (i.e., during drying, firing, or both drying and firing). Of course, such dimensional changes may be difficult to predict or control and may adversely influence the variability in the electrical properties of a screen-printed passive element. Thus, as mentioned above, compared to many other deposition processes, conventional screen printing is a relatively imprecise process with respect to dimensional tolerances. Accordingly, since the resistance of a screen-printed resistor is related directly to its dimensions, the resistance of a screen-printed resistor or another electrical component may be, correspondingly, relatively imprecise.

For instance, screen-printed resistors may exhibit dimensional tolerances of about ±100 μm. Correspondingly, screen-printed resistors may be typically limited to dimensions of larger than about one square millimeter, since the resistance of a screen-printed resistor of about one square millimeter may generally vary by about 20% to 30% if formed by screen printing, due, in large part, to the variability of its length, width, and thickness. Accordingly, screen-printed resistors which exhibit adequate tolerances in resistance may require the physical size of the resistor to be larger than would otherwise be desirable. Thus, variability with respect to the electrical properties (i.e., resistance) of less than ±20% may be difficult to achieve by conventional screen-printing methods for passive elements having an area of less than about one square millimeter.

For this reason, laser trimming is widely used to adjust the resistance of screen-printed resistors. Laser trimming processes typically involve ablation of a portion of the screen-printed resistor, which increases the electrical resistance thereof. However, laser trimming may be cost prohibitive and may require additional processing time. Also, the resistor must generally be exposed at a surface thereof to allow for laser trimming. As another consideration, resistors which have resistances which exceed a desired magnitude may not be adjusted via laser trimming techniques.

Thus, considering the conventional processes and limitations thereof, undesirably, resistors or other passive electrical components formed on the surface of a substrate via conventional screen-printing processes may occupy a relatively large area on the surface thereof. Limiting the available area may detrimentally influence placement of other circuit components, which may require surface mounting. Therefore, conventional formation of passive elements on the surface of a substrate may be an impediment to design flexibility.

A number of approaches for increasing the accuracy of screen-printed resistors have been developed. For instance, U.S. Pat. Nos. 6,229,098 and 6,171,921 to Dunn et al. each disclose a process for forming a screen-printed resistor with relatively precisely controlled dimensions, thus yielding a relatively precise resistance value. More particularly, U.S. Pat. Nos. 6,229,098 and 6,171,921 to Dunn et al. each disclose that an opening may be photodefined in the surface of a photoimageable layer and then filled via screen printing with resistive material. However, photoimaging processes may be costly, time-consuming, or both.

From the above, it can be seen that conventional processes and practices with respect to the fabrication of screen-printed resistors and other passive electrical elements may necessitate a compromise between the precision of the resistance value and the size of the resistor. In other words, while smaller resistors are often preferred to yield a more compact circuit, an undesirable consequence is that resistance values are less predictable due to the dimensional variability thereof. Accordingly, a need exists for a method for producing passive elements that overcomes some of the difficulties associated with conventionally formed passive elements.

BRIEF SUMMARY OF THE INVENTION

The present invention relates to an interposer for assembly with a semiconductor die including at least one passive element, the at least one passive element having relatively precise dimensions, which are defined, at least in part, by at least one recess formed in a dielectric layer of the interposer. The dielectric layer may be substantially free of photopolymer. Generally, the at least one recess in the interposer may be formed by removing a portion thereof, by, for instance, laser ablation, drilling, milling, punching, or etching. Furthermore, the at least one recess may be at least partially filled with a conductive material, such as, for instance, a conductive paste to form the at least one passive element. The conductive paste may be at least partially cured, dried, or both to form a relatively stable electrical element.

In one aspect of the present invention, a method for forming a semiconductor die interposer is disclosed, the interposer including at least one passive element. More specifically, a substrate may be provided, the substrate including at least one dielectric layer and at least one electrically conductive layer at least partially superimposed therewith. Further, at least one recess may be formed at least partially within the at least one dielectric layer by removing a portion thereof. Also, the dimensions of the at least one recess may be selected for causing an at least one passive element to exhibit an intended magnitude of at least one electrical property. Conductive material may be deposited at least partially within the at least one recess to form the at least one passive element. At least one conductive trace may be formed to electrically communicate with the at least one passive element. An interposer of the present invention may be assembled with a semiconductor die and encapsulated to form a semiconductor package.

In another aspect of the present invention, an interposer for assembly with a semiconductor die may include at least one dielectric layer and at least one passive element disposed at least partially within at least one recess formed in the at least one dielectric layer. In addition, the dimensions of the at least one recess may be selected for forming a passive element exhibiting an intended magnitude of at least one electrical property. The interposer may include at least one conductive layer extending in a superimposed relationship along at least a portion of a surface of the at least one dielectric layer.

A wafer-scale interposer is also disclosed, including a plurality of interposers, each comprising a substrate, including at least one dielectric layer and at least one conductive layer. At least one recess may be formed in the at least one dielectric layer of each of the plurality of interposers. Further, each of the plurality of interposers may include at least one passive element positioned at least partially within the at least one recess formed in the at least one dielectric layer thereof, respectively. Also, the dimensions of the at least one recess may be selected for producing an intended magnitude of at least one electrical property of the at least one passive element positioned at least partially therein during operation thereof. The wafer-scale interposer may be assembled with a wafer comprising a plurality of semiconductor dice and subsequently singulated and encapsulated to form individual semiconductor packages. Alternatively, the wafer-scale interposer may be assembled with a plurality of individual semiconductor die and subsequently singulated and encapsulated to form individual semiconductor packages.

A system including an interposer of the present invention is also disclosed. The system may comprise an electronic device, such as a computing device. Further, the system may include at least one input device (e.g., mouse, push-button, touch screen, communication interface, hard drive, etc.) and at least one output device (e.g., a display, printer, communication interface, hard drive, etc.). The system may be utilized in various computing environments, systems, and devices, such as, for example, cell phones, personal data assistants (PDAs), and other similar electronic devices.

Other features and advantages of the present invention will become apparent to those of skill in the art through consideration of the ensuing description, the accompanying drawings, and the appended claims.

DETAILED DESCRIPTION OF THE INVENTION

Generally, the present invention contemplates methods of manufacture of an interposer for use in semiconductor device assemblies, packages, and assemblies and packages including multi-chip modules. In one aspect of the present invention, a method of manufacturing an interposer including at least one passive element is disclosed.

In the following detailed description, reference is made to the accompanying drawings hereof, which illustrate specific embodiments in accordance with the present invention. It should be understood that other embodiments may be utilized, and that various structural, process, or structural and process changes may be made to the described embodiments of the present invention without departing from the spirit and scope thereof. In addition, for clarity, like numerals are used to refer to like elements and functions in the various figures of the drawings and for illustrating the different embodiments of the present invention. For instance, while the following drawings and discussion relate to interposer and semiconductor device configurations termed "flip-chip," as known in the art, the present invention may include other rigid or flexible interposer configurations, without limitation.

In addition, reference is made herein to screen-printing methods and materials. "Screen-printing," as used herein, refers generally to a method of physically depositing a paste or ink upon a surface or within a recess as described in greater detail herein and also encompasses so-called "thick-film" processes and materials as known in the art. In addition, while conventional screen-printing processes usually employ movement of a squeegee or blade member across a surface of a stencil, the term "screen-printing," as used herein, also refers generally to processes wherein a conductive paste is deposited at least partially within a recess by movement of the squeegee or blade member across a surface into which the recess is formed (i.e., without a stencil).

Figure 1:
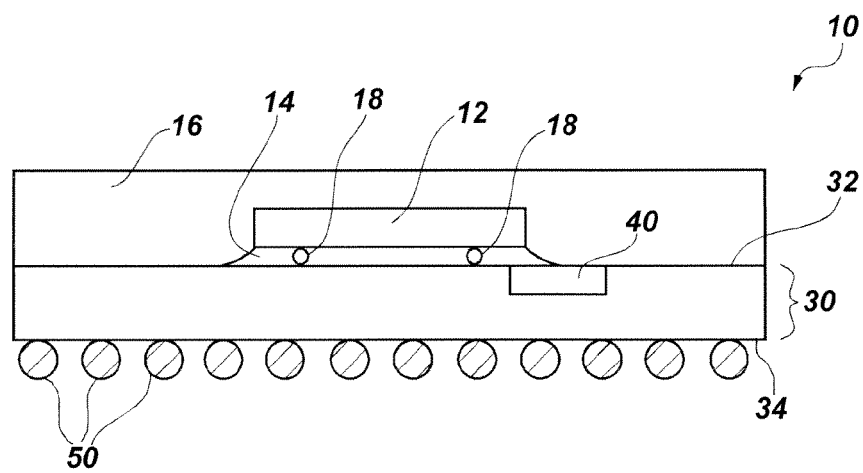
FIG. 1 is a side cross-sectional view of a schematic representation of a semiconductor die assembly of the present invention.

A semiconductor device package 10 in accordance with the present invention is illustrated in FIG. 1. Semiconductor device package 10 may include interposer 30 and semiconductor die 12, wherein semiconductor die 12 is encapsulated within encapsulant 16. To facilitate integration and electrical communication of active and passive elements of semiconductor device package 10, the interposer 30 may include at least one conductive via (not shown), conductive layer (not shown), or dielectric layer (not shown), as known in the art, that electrically connect solder balls 50 disposed on the lower surface 34 thereof to regions of the upper surface 32 thereof that correspond to solder bumps 18.

Interposer 30 may be formed from either a rigid or flexible material and may be substantially planar. Silicon or another semiconductor material (e.g., gallium arsenide, indium phosphide, etc.) may comprise at least a portion of interposer 30 and interposer 30 may further comprise a dielectric material (e.g., a silicon oxide or silicon nitride) to prevent electrical shorting of the conductive structures thereof. The dielectric material comprising the interposer 30, or at least one layer or portion thereof, may be substantially free of photopolymer. Suitable materials for forming the interposer 30 may include, without limitation, FR-4 board, glass, plastic, ceramics, and polyimide. Accordingly, the interposer 30 may comprise a so-called "rigid" or "flex" interposer structure, without limitation. In addition, interposer 30 may include a flex-circuit (e.g., tape automated bonding) interconnection through which a semiconductor die 12 may be connected to interposer 30.

According to the present invention, the interposer 30 may include at least one passive element 40. For example, the at least one passive element 40 may comprise an inductor, a resistor, or a capacitor. In addition, the passive element 40 may be formed at least partially within a dielectric layer of the interposer 30, as described in further detail hereinbelow.

The at least one passive element 40 may be separated from the upper surface 32 by a barrier layer (not shown) thereof. Though described as inductors, resistors, or capacitors, a passive element 40 of the present invention may be any device which exhibits an electrical property independent of an external power source. As known in the art, passive element 40 of interposer 30 may be interconnected to semiconductor die 12 by conductive traces (not shown) formed upon the upper surface 32 of interposer 30.

As shown in FIG. 1, the semiconductor die 12 may be preferably flip-chip mounted onto interposer 30 through solder bumps 18, which connect to associated conductive traces (not shown) of the interposer 30. As shown in FIG. 1, the stand-off gap between the semiconductor die 12 and the interposer 30 may be filled with an underfill material 14. The underfill material 14 may provide for passivation and may enhance the fatigue characteristics of the solder bumps 18, which connect the semiconductor die 12 to the interposer 30.

Alternatively, the interposer 30 and semiconductor die 12 may be configured with at least one wire bond extending therebetween, as known in the art. As mentioned above, the present invention is not limited to an interposer configuration suited for flip-chip style electrical mounting; rather, the present invention contemplates an interposer for use with a semiconductor die in any configuration as known in the art.

Further, a dielectric layer may be formed on one or both sides of the interposer 30 and may provide an effective electrical insulation between the at least one passive element 40, (e.g., an inductor, a capacitor, or a resistor) and other electrically conductive members thereof. Such a dielectric layer may inhibit performance degradation of the at least one passive element 40, by reducing loss caused by the inherent conductance of the interposer 30. For instance, a silicon oxide (SiO) layer may be formed on one or both sides of the interposer 30.

Of course, at least one passive element 40 of the present invention may be disposed entirely within (i.e., not at least partially exposed at a surface of the interposer 30) the interposer 30 as shown in FIG. 1. In such a configuration, the interposer 30 may include at least one conductive via (not shown), a conductive layer (not shown), as known in the art, for electrically connecting the at least one passive element 40 to solder balls 50 disposed on the lower surface 34 thereof, and regions of the upper surface 32 thereof that correspond to solder bumps 18, or both.

Figure 2A:
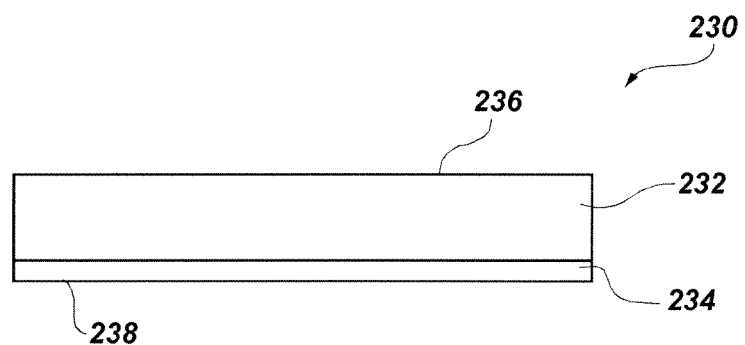
FIG. 2A is a side cross-sectional view of an interposer of the present invention.

The process for forming an interposer 230 according to the present invention and including at least one passive element 40 will next be described with reference to FIGS. 2A-2F. FIG. 2A shows an interposer 230 of the present invention including dielectric layer 232 and conductive layer 234. Dielectric layer 232 may preferably comprise a dielectric layer, such as polyimide, while conductive layer 234 may preferably comprise a metal, such as copper. In further detail, interposer 230 may be flexible or may be rigid, as known in the art. Further, although the interposer 230 as shown in FIG. 2A includes one conductive layer 234, the present invention contemplates that interposer 230 of the present invention may include one or more conductive layers, as described in further detail hereinbelow. Further, interposer 230 may comprise one or more so-called prepreg films, which generally refer to a film (conductive or non-conductive) that is pre-manufactured and which may be used to form one or more "layers" of the interposer 230. Of course, a prepreg film may be adhered or otherwise affixed to another layer of the interposer 230.

Figure 2B:
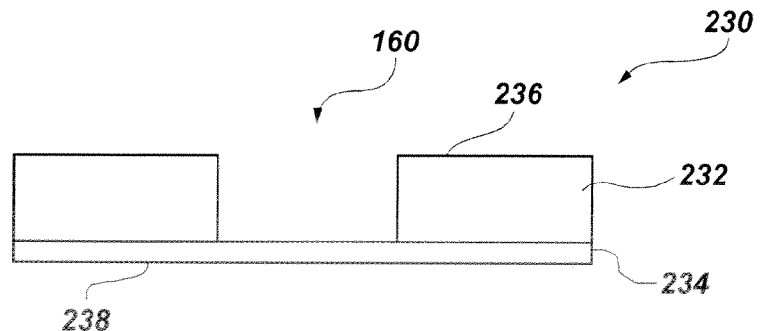
FIG. 2B is a side cross-sectional view of the interposer shown in FIG. 2A including a recess formed therein.

As shown in FIG. 2B, recess 160 may be formed within interposer 230, at least within a portion of dielectric layer 232, but may extend to conductive layer 234 or partially thereinto, without limitation. Recess 160 may be formed for accepting a material deposited therein by removing at least a portion of the dielectric layer 232. Further, the dimensions of the recess 160 may be selected for forming a passive element which exhibits an intended or anticipated magnitude of at least one electrical property (e.g., electrical resistance).

For instance, theoretically, the electrical resistance of a resistor may be calculated by the equation:

$$R = \Omega \frac{L}{Wt}$$

Wherein:
R is the electrical resistance;
L is the length of the resistor;
W is the width of the resistor;
t is the thickness of the resistor;
$\Omega$ is the electrical resistance value of the paste per unit area thereof;
L is substantially aligned with the direction of current flow through the resistor; and
t and W are substantially transverse to the direction of current flow through the resistor.

Therefore, if the variability of the dimensions of a screen-printed or thick-film resistor may be limited or reduced, the variability of the electrical resistance of a passive element so formed may be reduced accordingly. More generally, by reducing the variability of the dimensions of a passive element, the variability of an electrical property thereof may be reduced correspondingly. Particularly, deposition of an electrically conductive material at least partially within a recess formed in an interposer may reduce the variability in the dimensions of a passive element so formed. Additionally, forming a boundary which limits the location of a passive element may allow for improved design flexibility. For instance, as described hereinabove, since conventionally formed screen-printed or thick-film passive elements may exhibit variability in their dimensions upon being deposited and may slump or deform in response to drying or firing, such dimensional inaccuracies may require that electrically separate conventionally screen-printed components are physically separated by at least about 100 μm. As described hereinbelow in further detail, by the methods of the present invention, adjacent passive elements may be positioned more closely in relation to one another.

Referring now to FIGS. 2C-2F, recess 160 may be formed within interposer 230 through a variety of techniques, as described below.

For instance, recess 160 may be formed by removing at least a portion of the dielectric layer 232 via an etching process. Generally, the present invention contemplates that etching processes as known in the art may be employed, such as, for instance, wet etching, dry etching, anisotropic etching, or isotropic etching. More specifically, by way of example and not by limitation, plasma etching, ion beam etching, ion beam milling, reactive ion beam etching, chemical dry etching, chemical etching in a plasma, chemical-physical etching, or chemical wet etching may be employed for forming recess 160. Of course, the etching process and materials may be selected and tailored according to the material within which the recess 160 is to be formed (e.g., dielectric layer 232).

Semiconductor manufacturing may typically employ a resist over at least a portion of a surface to be etched. The resist may comprise a photoresist, wherein photosensitive film is coated over a surface and photochemically fixed or cured thereon. Wet etching may be commonly used for forming a desired topography in an oxide material, wherein a typical etchant may include hydrofluoric acid, ammonium fluoride, or a mixture thereof. Alternatively, a typical dry etching process may utilize fluorine atoms (e.g., generated in a discharge of nitrogen trifluoride) to etch silicon. It may be appreciated that many different etchant variations and process environments are known in the art for etching a substrate of a given material or materials.

Figure 2C:
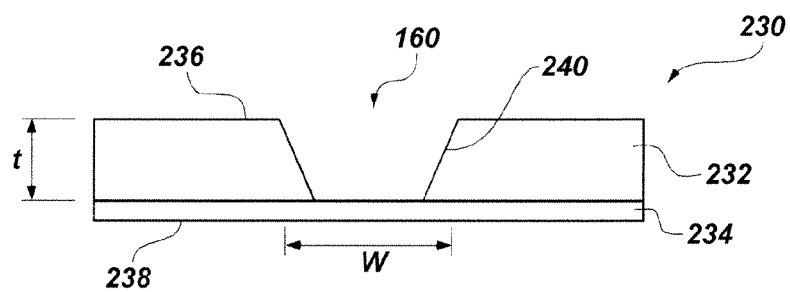
FIG. 2C is a side cross-sectional view of the interposer shown in FIG. 2A including a recess formed therein by way of etching.

Accordingly, a resist and etch process may be performed wherein a resist layer (not shown) may be formed over a portion of the upper surface 236 of dielectric layer 232. Then, the portion of the exposed dielectric layer 232 may be removed to expose a portion of conductive layer 234 by, for instance, an etching process to form recess 160, as shown in FIG. 2C. Subsequent to etching, resist layer (not shown) may be removed (stripped). Etching recess 160 into dielectric layer 232 may cause the side walls 240 defining recess 160 to exhibit a taper. Such behavior may be predictable or alterable based on the material comprising dielectric layer 232 and the thickness, labeled "t" thereof, the type of etching performed, and other characteristics of the process. Therefore, the dimensions of the recess 160 may be controllable, predictable, or both. Generally, chemical etching may be utilized to form a recess 160 having dimensional tolerances relating to the width W and length L (FIG. 2F), without respect to any taper, of about ±20 μm.

Figure 2D:
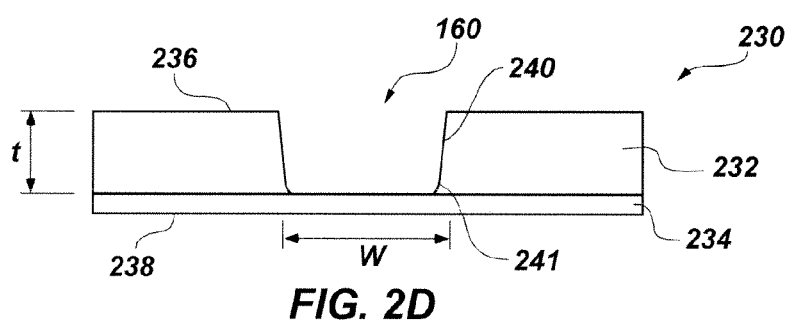
FIG. 2D is a side cross-sectional view of the interposer shown in FIG. 2A including a recess formed therein by way of laser ablation.

Alternatively, recess 160 may be formed by way of laser ablation. As known in the art, a laser beam may be directed toward the upper surface 236 of interposer 230, to ablate portions of dielectric layer 232 to form a recess 160 having selected dimensions. As shown in FIG. 2D, the side walls 240 of recess 160 may exhibit a slight taper and may also include a radius or fillet 241 proximate the conductive layer 234. Such characteristics may be predictable or alterable and, therefore, may be considered with respect to the dimensions of recess 160. Generally, laser ablation may be utilized to form a recess 160 having dimensional tolerances relating to the width W and length L (FIG. 2F), without respect to any taper, of about ±5 μm.

Figure 2E:
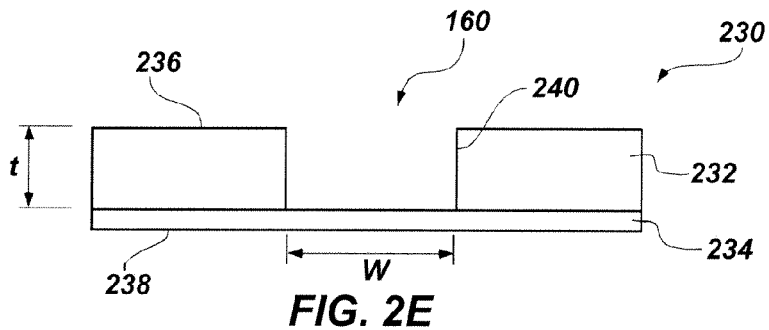
FIG. 2E is a side cross-sectional view of the interposer shown in FIG. 2A including a recess formed therein by way of machining.

In another alternative, as shown in FIG. 2E, recess 160 may be formed by way of mechanical punching. As known in the art, a punch (not shown) and corresponding die (not shown) may be positioned adjacent and abutting upper surface 236 and lower surface 238 of interposer 230, respectively. Of course, the punch and die may be sized and configured for forming an aperture of selected dimensions, as known in the art. Subsequent to positioning a punch and die adjacent and abutting upper surface 236 and lower surface 238 of interposer 230, force may be applied to bias the punch and corresponding die toward one another, ultimately causing the punch to pass through the interposer 230 disposed therebetween, to form recess 160 having selected dimensions for forming a passive element having at least one intended electrical property.

Of course, the recess 160 may be punched through dielectric layer 232 prior to formation or affixation of conductive layer 234. Alternatively, recess 160 may be punched through both dielectric layer 232 and conductive layer 234. Then, an additional conductive layer (not shown) may be affixed or formed along the lower surface 238 of the interposer 230. Generally, punching processes may be utilized to form a recess 160 having dimensional tolerances relating to the width W and length L (FIG. 2F), without respect to thickness "t," of about ±20 μm.

In another alternative, still referring to FIG. 2E, recess 160 may be formed by way of machining. More particularly, recess 160 may be formed by way of drilling or milling. As known in the art, a machining tool, such as, for instance, a drill bit or milling bit may be rotated at relatively high speeds and plunged or moved into the interposer 230 to a depth corresponding to "t." Alternatively, a drill bit or milling bit may be rotated at relatively high speeds and plunged or moved through the thickness of dielectric layer 232 and conductive layer 234 may be affixed or formed thereon subsequent to the machining of recess 160. Of course, the machining tool may be sized and configured and its machining path may be selected for forming a cavity of selected dimensions for forming a passive element having at least one intended electrical property.

Recess 160 may be machined through dielectric layer 232 at least to conductive layer 234. Alternatively, recess 160 may be machined through both dielectric layer 232 and conductive layer 234. Then, an additional conductive layer (not shown) may be affixed or formed along the lower surface 238 of the interposer 230. Generally, machining processes may be utilized to form a recess 160 having dimensional tolerances relating to the lateral dimensions (FIG. 2F), without respect to thickness "t," of about ±30 μm.

Figure 2F:
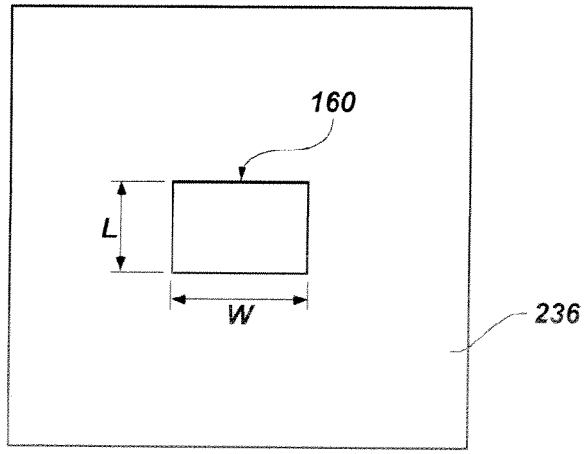
FIG. 2F is a top elevation view of an interposer of the present invention including a recess formed therein.

FIG. 2F shows recess 160 formed into interposer 230 in a top elevation view. The shape of lateral dimensions of recess 160 may be generally rectangular, having a width W and a length L, as shown in FIG. 2F. Alternatively, recess 160 may be generally circular, generally square, generally triangular, generally oval, generally polygonal, or as otherwise desired or known in the art.

Figure 2G:
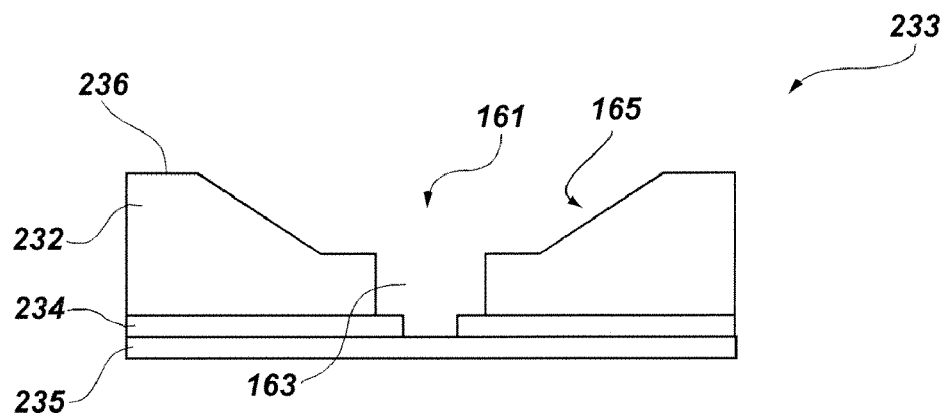
FIG. 2G is a side cross-sectional view of an interposer of the present invention including a recess formed therein having differently shaped regions.

Of course, a recess for forming a passive element according to the present invention may comprise any suitable or desirable geometry. For example, the portion of recess 161, as shown in FIG. 2G in a side cross-sectional view of interposer 233, formed within dielectric layer 232 may include a substantially uniform region 163 and a tapered region 165. Also, as shown in FIG. 2G, a portion of recess 161 may be formed by conductive layer 234 and dielectric layer 235. The regions 163 and 165 of recess 161 may each be formed by different processes, as described above, by the same process (e.g., laser ablation) or as otherwise known in the art. Such a configuration may provide a greater surface area of the passive element (not shown) at the upper surface 236 of the interposer 233. Additionally or alternatively, such a configuration may provide different regions 163 and 165 of recess 161 which are sized and configured for exhibiting different electrical properties.

Once a recess according to the present invention (recess 160 will be referred to hereinbelow for simplicity) has been formed, the present invention contemplates that electrically conductive material may be at least partially deposited therein. Generally, electrically conductive material may be at least partially deposited within recess 160 mechanically. Explaining further, processes which move, push, spray, or force electrically conductive material into recess 160 may be utilized. In one example, a screen-printing process may be performed for depositing a paste, or ink, within the recess 160 formed in the interposer 230 in order to form a passive element according to the present invention.

As described in further detail hereinbelow, a squeegee may be used to force a paste or ink through openings in a screen or stencil into a cavity formed within a substrate. The screen or stencil may be typically constructed of stainless steel, and may have a predefined pattern that determines the placement of the paste on the substrate. The pastes commonly used in screen-printing processes usually include an organic vehicle, glass frit, and active materials, such as dielectric materials for insulating films, elemental metals or alloys for conductor films, or semiconductor compounds or alloys for resistor films. For instance, screen-printing paste may comprise carbon or silver-filled epoxy pastes. Commercially available pastes for use in screen-printing processes are available from Asahi Chemical of Tokyo, Japan. In a particular example, so-called polymer thick-film ("PTF") pastes may be used.

A screen-printing process of the present invention is depicted in FIGS. 3A-3D, which illustrate, respectively, a screen-printing apparatus and method. Of course, other screen-printing apparatus as known in the art may be utilized in accordance with the present invention, without limitation. Squeegee assembly 310 may include a movable head 320 and a blade 322 secured thereto and projecting downward therefrom. The blade 322 may be typically molded from neoprene or polyurethane, or another resilient material, and may have a cross-sectional profile generally as illustrated or as otherwise known in the art. The lower end of blade 322 may matingly engage the surface 344 of stencil 340 and a quantity of paste 324 may be provided thereon.

As the blade 322 moves laterally across the stencil 340, paste 324 may pass through at least one aperture 342 formed therein and may be deposited therein and into recess 160. A side wall (not labeled) of at least one aperture 342 of stencil 340 may be tapered, or may be configured as otherwise known in the art. Stencil 340 may be disposed upon the upper surface 236 of interposer 230 as the blade 322 translates therealong, or alternatively, stencil 340 may be disposed slightly thereabove, as known in the art.

Figure 3A:
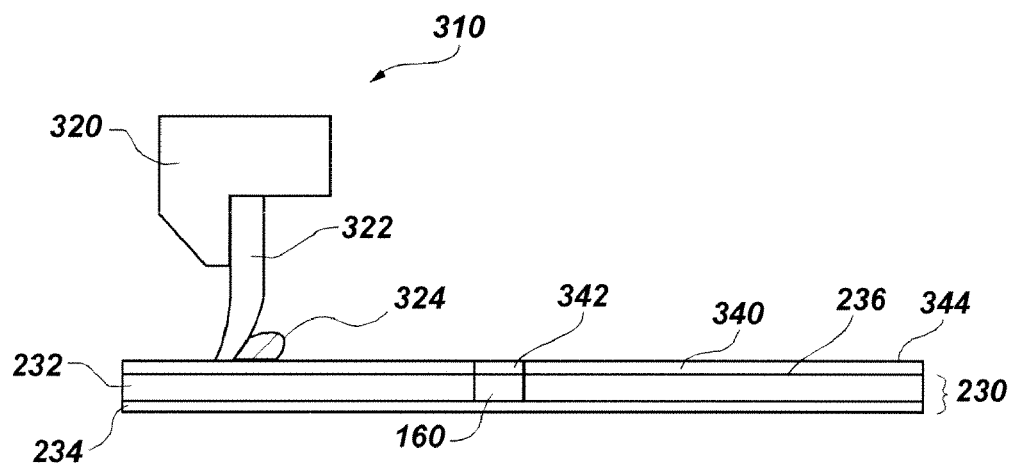
FIG. 3A is a side cross-sectional schematic view of a screen-printing process according to the present invention.
Figure 3B:
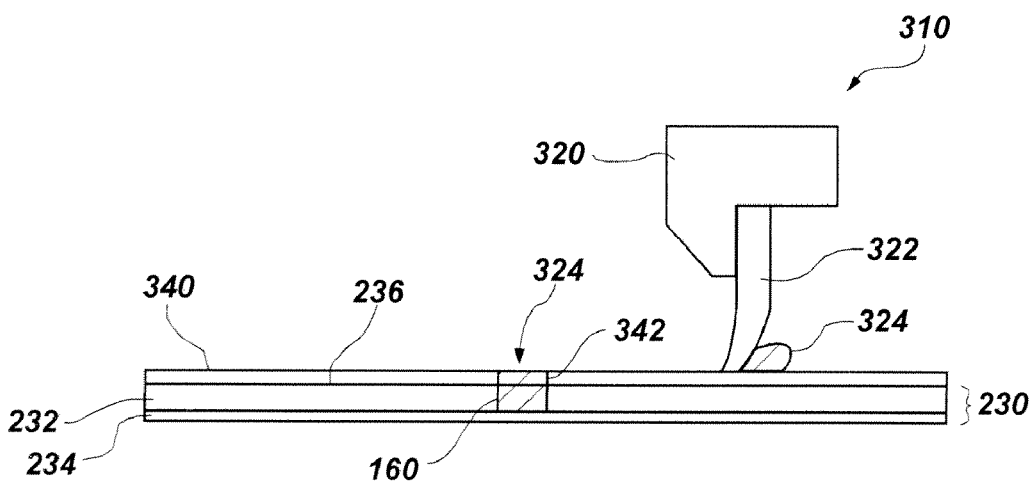
FIG. 3B is a side cross-sectional schematic view of a screen-printing process according to the present invention.
Figure 3C:
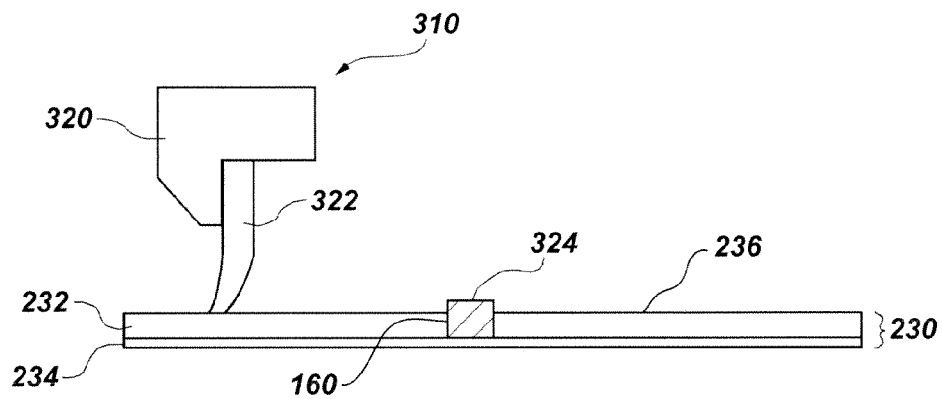
FIG. 3C is a side cross-sectional schematic view of a screen-printing process according to the present invention.
Figure 3D:
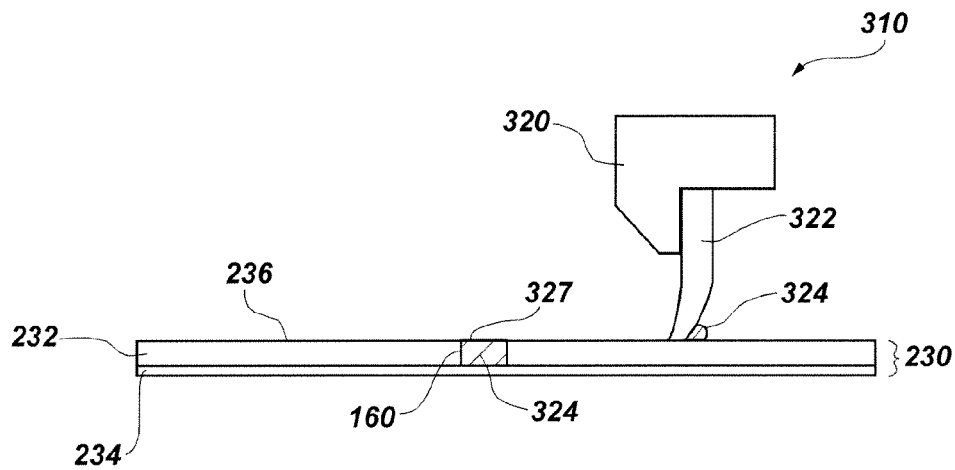
FIG. 3D is a side cross-sectional schematic view of a screen-printing process according to the present invention.

Subsequent to depositing paste 324 at least partially within recess 160, stencil 340 may be removed from adjacent the upper surface 236 of interposer 230. As shown in FIG. 3C, paste 324 may extend from recess 160 above the upper surface 236 of interposer 230. Therefore, optionally, blade 322 or another leveling apparatus may be employed to planarize or level the upper surface of the paste 324 disposed within recess 160 to form initial upper surface 327, as shown in FIG. 3D. Put another way, the upper surface of paste 324 may be leveled so as to exhibit an upper surface topography which is substantially coplanar with the surface 236 of interposer 230.

Of course, alternatively, paste 324 may remain extending from recess 160 above the upper upper surface 236 of interposer 230 if desired.

Figure 3E:
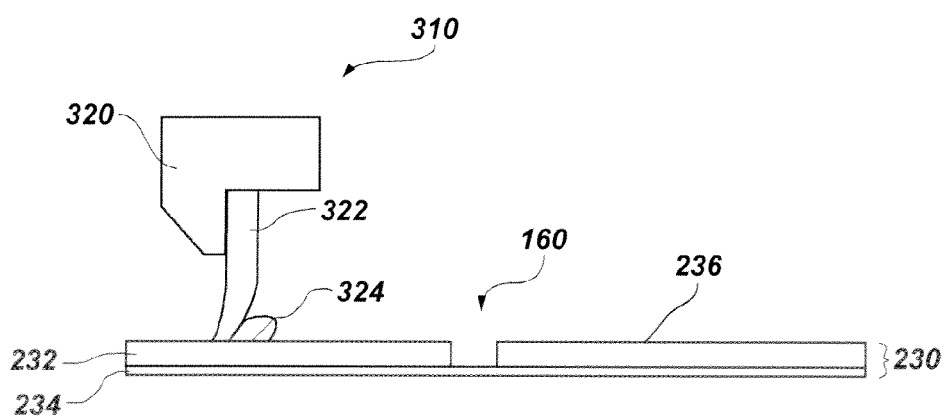
FIG. 3E is a side cross-sectional schematic view of a screen-printing process according to the present invention.
Figure 3F:
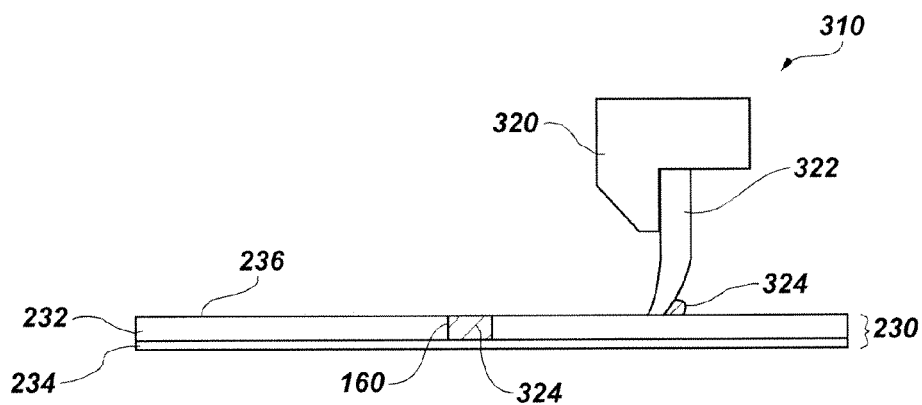
FIG. 3F is a side cross-sectional schematic view of a screen-printing process according to the present invention.

In an alternative process for depositing paste 324 within recess 160, as illustrated in FIGS. 3E and 3F, the present invention contemplates that conductive paste 324 may be deposited at least partially within recess 160 by providing the upper surface 236 of interposer 230 with a quantity of paste 324 and moving the blade 322 laterally thereacross. Accordingly, paste 324 may pass into recess 160 formed within the interposer 230 without utilizing a stencil 340 (FIGS. 3A and 3B). Such a process may reduce the complexity or length of time required to fabricate an interposer 230 of the present invention.

Optionally, in combination with the above-described processes or other processes as known in the art for depositing paste 324 within recess 160, paste 324 may be vibrated for promoting uniform filling of recess 160 therewith, or for promoting the distribution of paste substantially transverse to the direction of an earthly gravitational field. For instance, the present invention contemplates that vibration may be communicated indirectly to the paste 324 by vibrating the interposer 230, the squeegee assembly 310, or a combination thereof. Also, paste 324 may be vibrated during disposition thereof within recess 160, thereafter, or both during and after screen printing of paste 324 within recess 160. In addition, although FIG. 3G shows paste 324 as being deposited within recess 160, vibrational energy may be communicated to the paste 324 during any of the above-described screen-printing processes, intermittently, or as desired, without limitation.

Figure 3G:
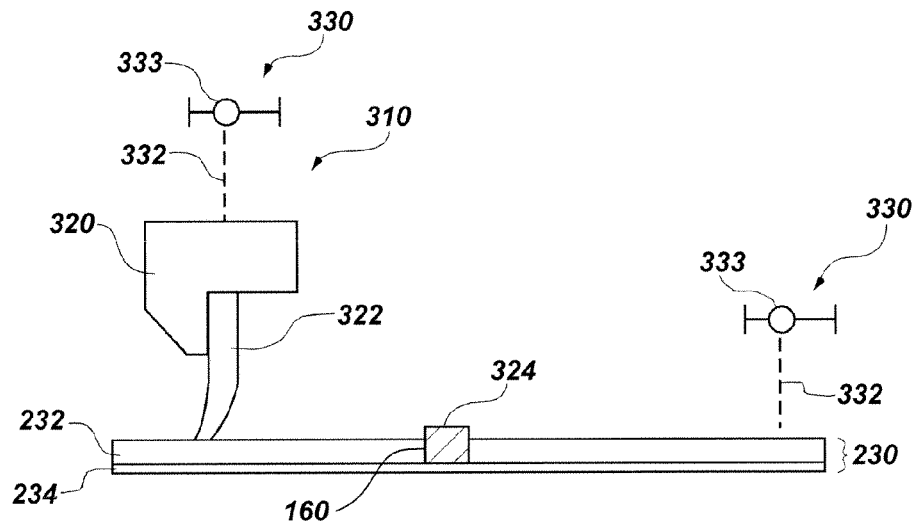
FIG. 3G is a side cross-sectional schematic view of a screen-printing process according to the present invention.

As shown in FIG. 3G, a vibration system 330 may be structurally coupled to the interposer 230, the squeegee assembly 310, or both. In more detail, vibration system 330 may include vibration generator 333, which may comprise a motor configured for rotating a mass having a center of mass which is positioned eccentrically with respect to the rotational axis of the motor, which is structurally coupled to the interposer 230, the squeegee assembly 310, or both via transmission element 332. Vibration of the paste 324 may be desirable for facilitating uniform or complete filling of recess 160 therewith. Of course, vibration may be generated by any method known in the art, such as, for instance, mechanical vibration or acoustic vibration, without limitation.

Figure 3H:
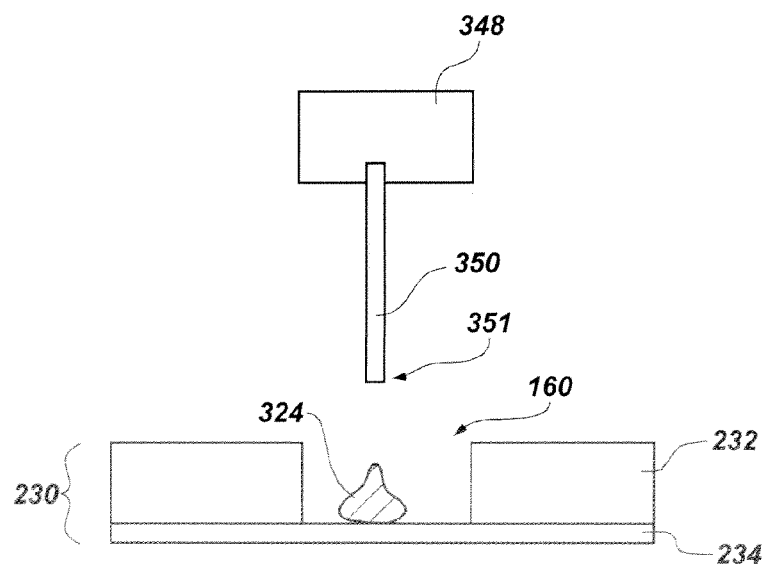
FIG. 3H is a side cross-sectional schematic view of an injection process according to the present invention.
Figure 3I:
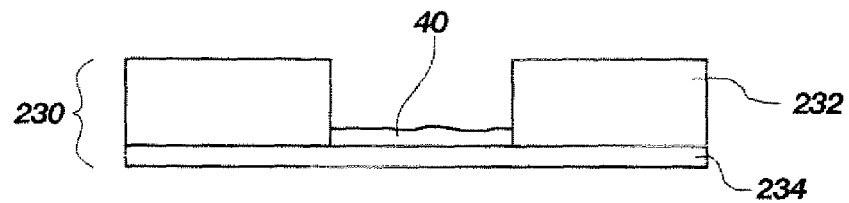
FIG. 3I is a side cross-sectional schematic view of an injection process according to the present invention.

Referring now to FIGS. 3H and 3I, an alternative method of depositing conductive paste 324 at least partially within recess 160 is described. As shown in FIG. 3H, paste 324 may be deposited by injection system 348, which is configured for positioning injection needle 350 proximate recess 160 and injection paste 324 therethrough and at least partially within recess 160. Injection system 348 may comprise a so-called "pick-and-place" system, which includes an injection system for expelling from the injection tip 351 of injection needle 350 a selected amount or quantity of paste 324. Vibration may also be advantageous for distributing paste 324 within the lower portion of recess 160 or, alternatively or additionally, paste 324 may be distributed to form a passive element 40 having a substantially constant thickness, as shown in FIG. 3I, by way of heating. Subsequently, passive element 40 may be at least partially cured and, optionally, dried to form a relatively electrically stable material.

In another aspect of the present invention, conductive material may be deposited within a portion of recess 160 by way of so-called maskless mesoscale materials deposition ("M³D"). For instance, a material may be aerosolized by using an ultrasonic transducer or a pneumatic nebulizer. Then, the aerosol stream may be focused using a flow guidance deposition head, which forms an annular, coaxial flow between the aerosol stream and a sheath gas stream. Further, patterning may be accomplished by moving the substrate or deposition head relative to one another. The deposited material may be heated to form a substantially dense electrically conductive material. For instance, the deposited material may be heated in an oven or by exposure to a laser beam. In addition, conductive traces extending to or from a passive element of the present invention may be formed by way of maskless mesoscale materials deposition. Commercially available maskless mesoscale materials deposition apparatus are produced by Optomec of Albuquerque, N. Mex.

Figure 3J:
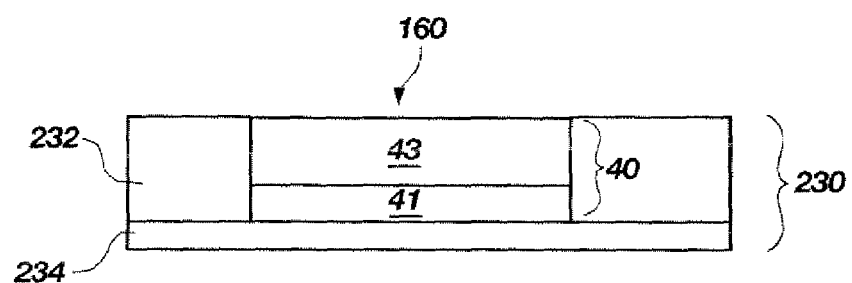
FIG. 3J is a side cross-sectional view of an interposer of the present invention including a passive element comprising a plurality of conductive layers.

The present invention also encompasses that a recess 160 may include a plurality of conductive layers. For instance, as shown in FIG. 3J, passive element 40 formed within interposer 230 may comprise a first conductive layer 41 and a second conductive layer 43. Of course, first conductive layer 41 and second conductive layer 43 may exhibit different electrical properties. Further, at least one characteristic relating to an electrical property of the second conductive layer 43 may be selected for influencing an electrical property of the passive element 40. Explaining further, a first conductive layer 41 may be formed within recess 160 and at least one electrical property thereof may be measured. Further, at least one characteristic relating to an electrical property of the second conductive layer 43 may be selected, prior to formation of second conductive layer 43, for influencing an electrical property of the passive element 40. Such a configuration may provide a process by which an electrical property of the passive element 40 may be "tuned" or adjusted, toward a desired magnitude of the electrical property, as the passive element 40 is formed. Of course, more than two conductive layers may comprise passive element 40, without limitation.

Figure 4A:
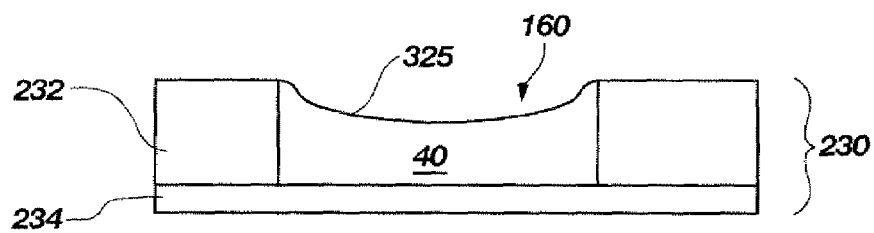
FIG. 4A shows a side cross-sectional view of an interposer including a passive element of the present invention.

As shown in FIG. 4A, the topography of upper surface 325 of paste 324 may be different than the initial upper surface 327 (as shown in FIG. 3D) deposited within recess 160 in response to curing, drying, or both. However, the sides of the recess 160 prevent the paste 324 from slumping laterally. Also, shrinkage due to drying or curing may be predictable or very small. Therefore, the electrical properties of the passive element 40 formed within recess 160 may be substantially determined by the dimensions thereof. Of course, a substantially planar upper surface 325 of paste 324 may be formed by planarizing (i.e., lapping or grinding) the dielectric layer 232 and the post-fired paste 324. Alternatively, additional layers of paste 324 may be formed onto post-fired paste 324 to reduce the variation of the topography of the upper surface 325 thereof after drying or firing. Such a configuration may further refine the accuracy or reproducibility with which at least one intended electrical property of a passive element may be exhibited.

Figure 4B:
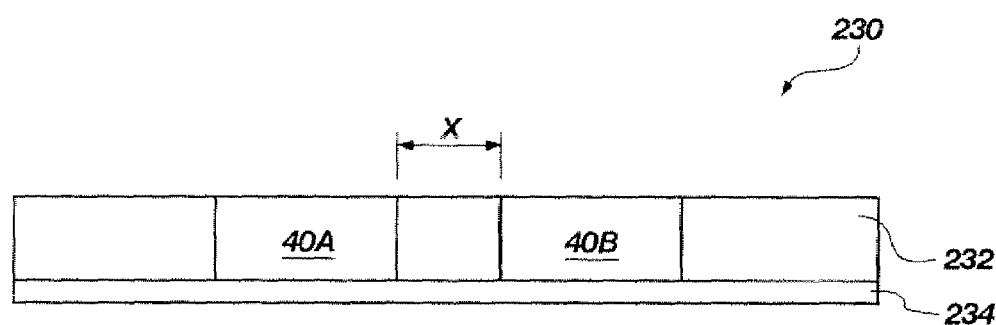
FIG. 4B shows a side cross-sectional view of an interposer including two adjacent passive elements of the present invention.

It may be appreciated that since the sides of the recess 160 prevent the paste 324 from slumping laterally, passive elements may be formed in relatively close proximity to one another. As shown in FIG. 4B, passive elements 40A and 40B may be separated by a distance X. For instance, if recesses forming passive elements 40A and 40B are each formed with a laser beam, distance X may be about 20 µm. Such a configuration may be advantageous for providing relatively high electrical component densities within an interposer 230 of the present invention.

As described above, it may be desirable to provide for electrical communication with a passive element of the present invention. Generally, electrical communication may be provided through conductive traces that extend along a surface of or vertically within the interposer 230. Of course, bond pads, solder bumps or balls, or other electrical connection techniques as known in the art may be utilized to provide electrical communication paths to a passive element.

Figure 4C:
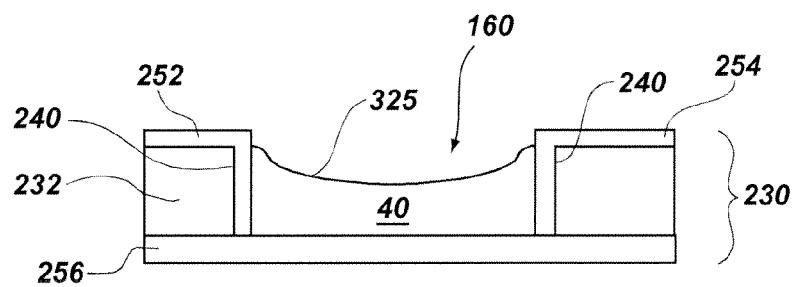
FIG. 4C shows a side cross-sectional view of an interposer including a passive element of the present invention.

In further detail, there may be many different configurations for electrical communication with the at least one passive element 40. For instance, FIG. 4C shows a cross-sectional view of a passive element 40 formed within interposer 230 wherein conductive traces 252 and 254 are formed upon at least a portion of the side walls 240 of the recess 160. Conductive traces 252 or 254 may be formed after recess 160 is formed by way of chemical vapor deposition, physical vapor deposition, atomic layer deposition, sputtering, plating, or other deposition techniques as known in the art. Of course, traces 252 and 254 may be patterned by resist and etch techniques on the surface of dielectric layer 232 as known in the art and configured for electrical connection to other electrical devices. Further, one or more additional conductive layers 256 may be provided along the upper or lower surface of dielectric layer 232 for communicating electrically with passive element 40.

Figure 4D:
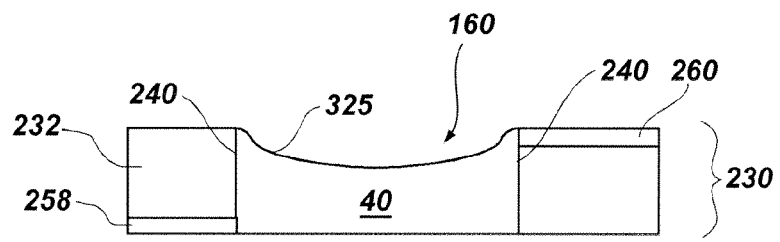
FIG. 4D shows a side cross-sectional view of an interposer including a passive element of the present invention.

Alternatively, FIG. 4D shows a cross-sectional view of passive element 40 formed within interposer 230 wherein conductive traces 258 and 260 extend to respective portions of side wall 240 of passive element 40. Such a configuration may be provided by forming a laminate structure of dielectric layer 232, conductive layer forming conductive trace 258, and conductive layer forming conductive trace 260 prior to forming recess 160. Thus, conductive layer forming conductive trace 258 and conductive layer forming conductive trace 260 may at least partially overlap or be at least partially superimposed in relationship with the intended position of recess 160. Then, as shown in FIG. 4D, recess 160 may substantially perforate dielectric layer 232, conductive layer forming conductive trace 258, and conductive layer forming conductive trace 260. Such a configuration may allow for electrical communication with passive element 40 via conductive traces 258 and 260, which abut at least a portion of a side wall 240 of passive element 40.

Figure 4E:
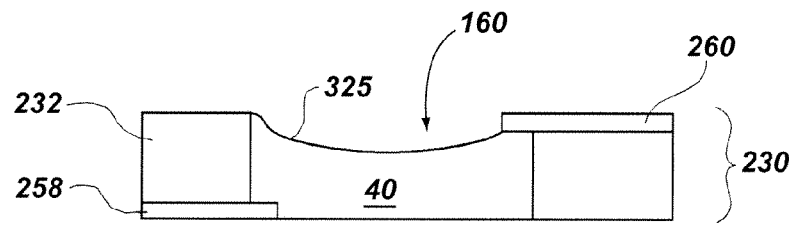
FIG. 4E shows a side cross-sectional view of an interposer including a passive element of the present invention.

In another alternative, FIG. 4E shows a cross-sectional view of passive element 40 formed within interposer 230 wherein conductive traces 258 and 260 laterally overlap or are superimposed with at least a portion of passive element 40. In such a configuration, recess 160 may be formed within the dielectric layer 232 prior to formation of conductive traces 258 and 260. Then, the conductive layer forming conductive trace 258 and, optionally, the conductive layer forming conductive trace 260 may be formed or affixed to dielectric layer 232 after passive element 40 is formed. Alternatively, one or both of conductive traces 258 and 260 may be formed prior to deposition of paste within recess 160. Thus, electrical communication with passive element 40 may occur via conductive traces 258 and 260.

Figure 5A:
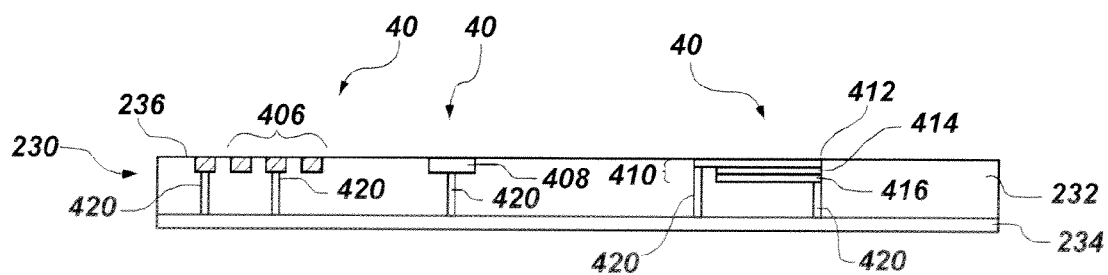
FIG. 5A is a side cross-sectional view of an interposer including an inductor according to the present invention.

Furthermore, as shown in FIG. 5A, the at least one passive element 40 may be sized and positioned within interposer 230 for providing selected electrical characteristics. For instance, as may be appreciated by the foregoing description, passive element 40 may comprise a resistor 408, an inductor 406, or a capacitor 410.

For instance, as shown in FIG. 5A, resistor 408 may be sized and positioned for providing a selected, intended magnitude of electrical resistance. Additionally, resistor 408 may communicate electrically with conductive layer 234 by way of conductive via 420, as known in the art.

Alternatively, one or more passive elements 40 may be sized and positioned to form a capacitor 410 for providing a selected magnitude of electrical capacitance. Capacitor 410 may comprise two conductive regions, a storage node 416 and a cell plate 412, which are separated by a dielectric layer 414 (i.e., a plate-type capacitor). Further, the present invention contemplates that the dielectric layer 414 may be formed by a screen-printing process or as otherwise known in the art. More particularly, storage node 416, cell plate 412, and dielectric layer 414 may be formed by sequentially partially filling a recess with a conductive material, a dielectric material, and another conductive material.

In further detail, capacitor 410 may be preferably metal-dielectric-metal capacitor formed by depositing a pair of metal layers, a storage node 416 and a cell plate 412, which are separated by a dielectric layer 414. The storage node 416 and the cell plate 412 are preferably formed of a metallic material and may have dimensions selected in relation to a desired, anticipated electrical capacitance of the capacitor 410. The storage node 416 may be electrically connected to other passive elements (not shown) and solder connections (not shown) through conducting lines (not shown) disposed within the interposer 230.

The dielectric layer 414 may be a layer of oxide which is formed after formation of the storage node 416. The dielectric layer 414 may comprise, for example, silicon dioxide and may be formed by a chemical deposition process. Alternatively, the dielectric layer 414 may comprise a non-conductive paste, such as, for instance, an epoxy paste, and may be screen printed or otherwise deposited, according to the present invention or as otherwise known in the art.

Figure 5B:
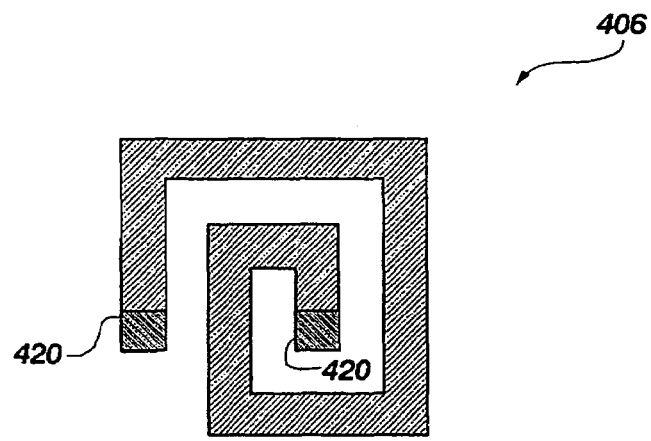
FIG. 5B is a top elevation view of the inductor shown in FIG. 5A.

Further, one or more passive elements 40 may be sized and positioned to form an inductor 406 having a selected, intended magnitude of electrical inductance. Inductor 406 may comprise an inductor formed by screen printing of a conductive layer in a generally spiral shape. Particularly, FIG. 5B shows a top view of inductor 406 comprising a substantially uniform thickness trace, wherein the trace extends from a generally interior position and spirals circumferentially about and radially outwardly therefrom. Configuring inductor 406 in a generally spiral arrangement may allow for reduction in the overall size inductor 406, in comparison to a non-spiral inductor, which may reduce resistance in each inductor 406 and, therefore, may result in higher Q factors thereof. To provide electrical contact to the inductors 406, conductive vias 420 may extend from inductor 406 to conductive layer 232.

Referring to FIG. 5A, the inductors 406, resistor 408, and capacitor 410 of the interposer 230 may be electrically connected by conductor lines to conductive layer 234, which may be formed at varying points in the processing of interposer 230, as desired. Further, conductive layer 232 may form a "bus" for connecting the inductors 406, resistor 408, capacitor 410, and any other electrical elements situated on or within the interposer 230.

In a further aspect of the present invention, although an interposer of the present invention is described above as including generally one dielectric layer and one conductive layer, the present invention is not so limited. Rather, an interposer of the present invention may include at least one dielectric layer and at least one conductive layer, without limitation. Accordingly, any number of conductive layers may be formed on or within any number of insulating layers as are desired for circuit connection depending upon the placement of passive or active devices comprising an interposer according to the present invention.

Figure 5C:
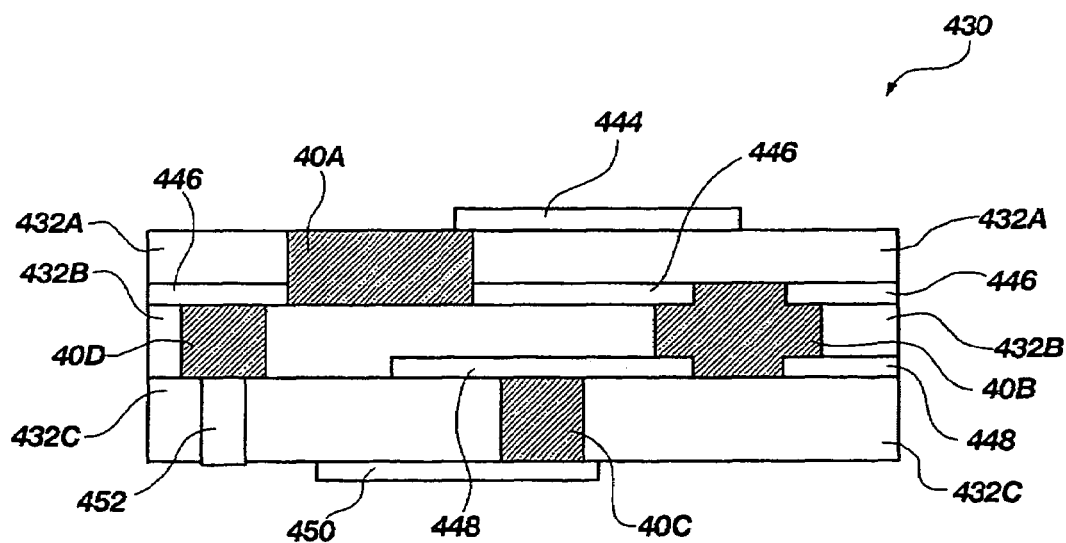
FIG. 5C is a side cross-sectional view of an interposer according to the present invention including more than one dielectric layer.

For instance, as shown in FIG. 5C, an interposer 430 of the present invention may include a plurality of dielectric layers 432A, 432B, and 432C, which include passive elements 40A, 40B, 40C, and 40D, respectively. In addition, conductive layers 444, 446, 448, and 450 may provide electrical communication between passive elements 40A, 40B, 40C, and 40D, as well as to other electrical components or devices. Further, one or more conductive vias 452 may also provide electrical communication between passive elements 40A, 40B, 40C, and 40D, as well as to other electrical components or devices. Thus, an interposer of the present invention may include at least one passive element formed at least partially within at least one dielectric layer thereof.

In a further contemplation of the present invention, generally, at least some of the plurality of layers of a multilayer interposer of the present invention may include at least portions of one passive element. Put another way, at least some of the plurality of layers of a multilayer interposer of the present invention may include a recess which is formed according to the present invention, as described hereinabove. Further, a passive element may provide at least one desired or anticipated electrical property. Optionally, a passive element may provide more than one desired or anticipated electrical property.

Figure 5D:
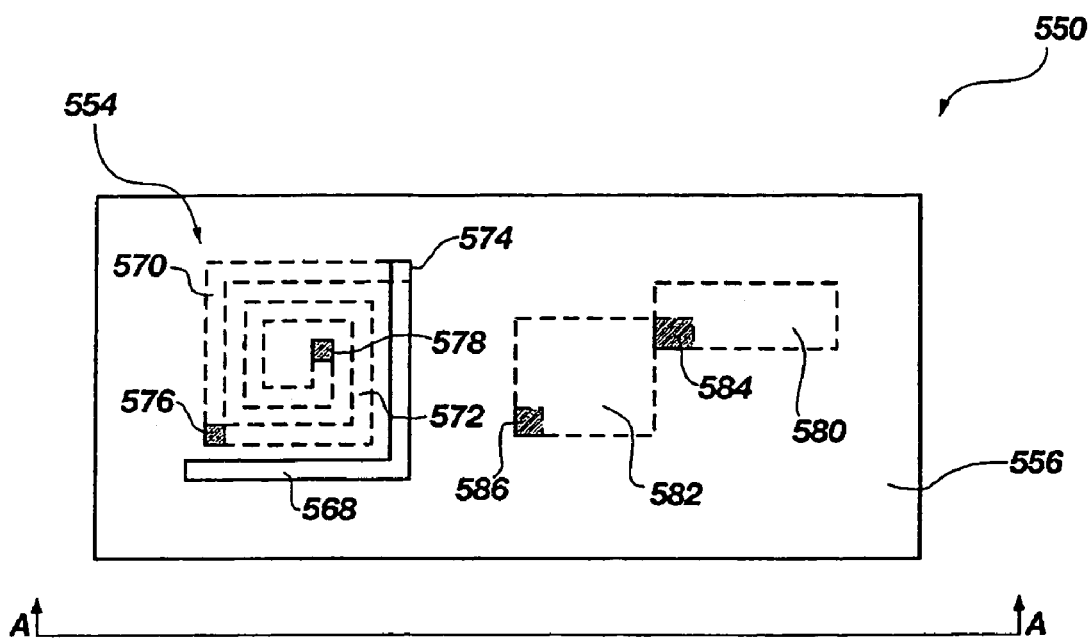
FIG. 5D is a top view of a multilayer interposer according to the present invention.
Figure 5E:
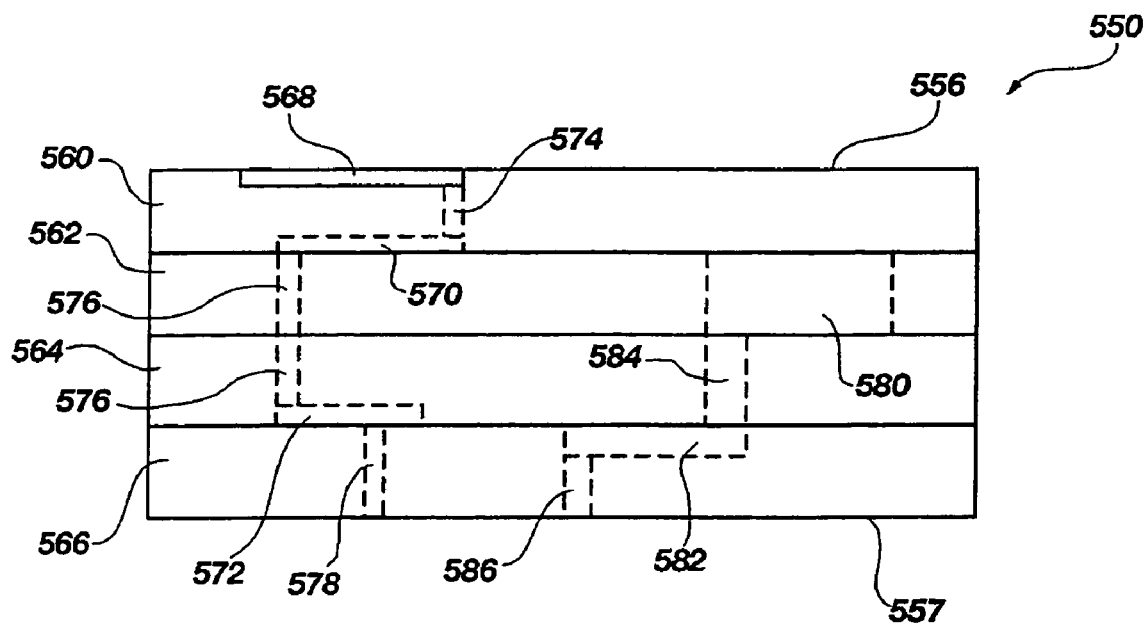
FIG. 5E is a side schematic view of the multilayer interposer shown in FIG. 5D.

For instance, FIG. 5D shows a top elevation view of a multilayer interposer 550 according to the present invention including dielectric layers 560, 562, 564, and 566, while FIG. 5E shows a schematic side view, in the direction and area depicted by reference line A-A, of multilayer interposer 550. As shown in FIGS. 5D and 5E, passive element 554 may comprise a generally spiral shape, as discussed above. However, passive element 554 may include a first portion 568 disposed within dielectric layer 560 and substantially coplanar with upper surface 556 thereof, a second portion 570 disposed within dielectric layer 560, and a third portion 572 disposed within dielectric layer 564. Conductive vias 574 and 576 electrically connect first portion 568, second portion 570, and third portion 572 to one another and conductive via 578 extends through dielectric layer 566 to lower surface 557 thereof. Conductive via 576 extends through both dielectric layers 562 and 564 and may be formed in separate pieces or as a monolithic member. Of course, conductive via 578 may be electrically connected to a conductive trace (not shown) for electrical communication with other devices (not shown).

It may be appreciated that passive element 554 may provide one or more intended or desired electrical properties. For instance, as noted above, a spiral-shaped electrical conductor may provide a magnitude of electrical inductance. Further, first portion 568 and second portion 570 are conductors separated by dielectric layer 560, and therefore, may provide a magnitude of electrical capacitance. Finally, of course, passive element 554 may provide a magnitude of electrical resistance. Summarizing, passive element 554 may be configured, sized, and positioned to provide at least one anticipated or desired electrical property. Also, different passive elements (i.e., resistive, capacitive, or inductive) may be positioned within different layers, respectively, of a multilayer interposer.

For instance, FIGS. 5D and 5E illustrate passive elements 580 and 582, which are electrically connected to one another by way of conductive via 584. Of course, optionally, a conductive trace (not shown) may electrically connect passive elements 580 and 582. Also, as shown in FIG. 5E, conductive via 586 extends between passive element 582 and lower surface 557 of dielectric layer 566. As shown in FIGS. 5D and 5E, passive elements 580 and 582 may be sized and positioned differently and, accordingly, may each exhibit at least one electrical property which differs in relation to one another.

Figure 6A:
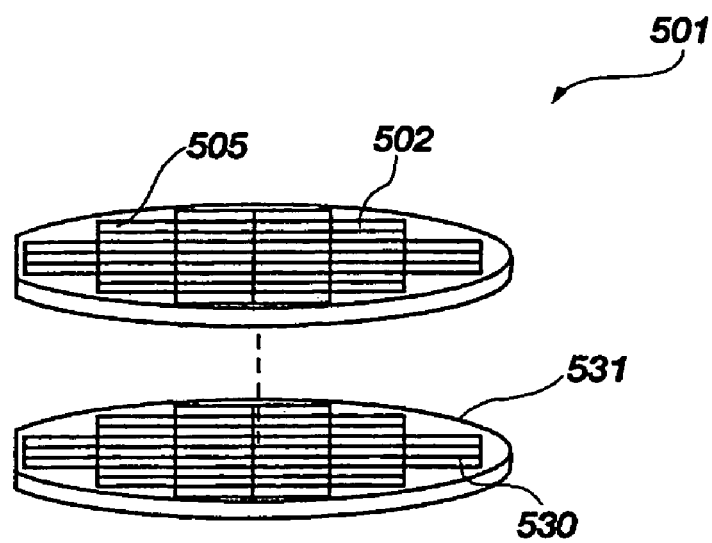
FIG. 6A is a perspective view of a wafer-scale interposer according to the present invention and a semiconductor wafer assembly.

In yet another aspect of the invention, a wafer-scale interposer substrate 531 comprising a plurality of wafer-scale interposers 530 may be formed and operably coupled or assembled to a wafer 502 comprising a plurality of semiconductor dice or devices 505 to form wafer-scale assembly 501, as shown in an exploded perspective view in FIG. 6A. Specifically, the wafer-scale interposer substrate 531 and wafer 502 may be aligned with one another and abutted against one another and affixed, so as to provide electrical communication therebetween by way of flip-chip assembly methods or wire-bonding, as known in the art. That is, each plurality of semiconductor dice or devices 505 of wafer 502 may be aligned with and electrically connected to a respective wafer-scale interposer 530 of wafer-scale interposer substrate 531. Subsequently, the wafer-scale assembly 501 may be singulated and, optionally, encapsulated to form a plurality of semiconductor device packages (e.g., semiconductor device package 10 shown in FIG. 1) according to the present invention.

Alternatively, such a wafer-scale interposer substrate 531 may be diced to form individual wafer-scale interposers 530 for use in the construction of a semiconductor device package (e.g., a semiconductor device package 10 shown in FIG. 1) according to the present invention to save time and production costs. Actual dicing of the wafer-scale interposer substrate 531 may occur at any stage of the processing thereof, such as, for example, after the wafer-scale interposer substrate 531 is populated with passive circuits as described above or following connection of wafer 502 thereto.

Figure 6B:
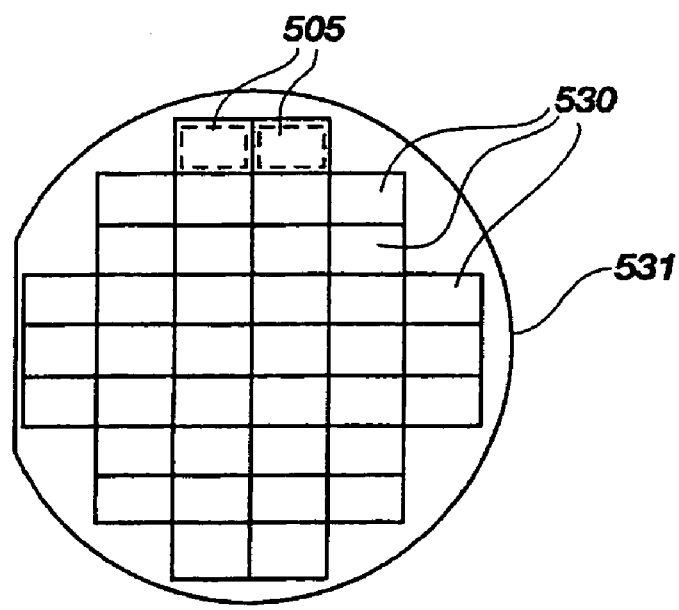
FIG. 6B is a top elevation view of a wafer-scale interposer according to the present invention including singulated semiconductor dice disposed thereon.

In yet a further alternative, a plurality of individual (singulated) semiconductor dice or devices 505 may be mounted upon the wafer-scale interposer substrate 531, as illustrated in FIG. 6B, which is a top elevation view of two individual semiconductor dice or devices 505 mounted upon a wafer-scale interposer substrate 531 of the present invention. Subsequent to mounting of individual semiconductor die or device upon the wafer-scale interposers 530 of the wafer-scale interposer substrate 531, the assembly thereof may be singulated and, optionally, encapsulated to form a plurality of semiconductor device packages (e.g., a semiconductor device package 10 shown in FIG. 1) according to the present invention. Such a method and configuration may provide an opportunity for verification or testing of the semiconductor dice prior to connection with the wafer-scale interposer substrate 531.

Figure 7:
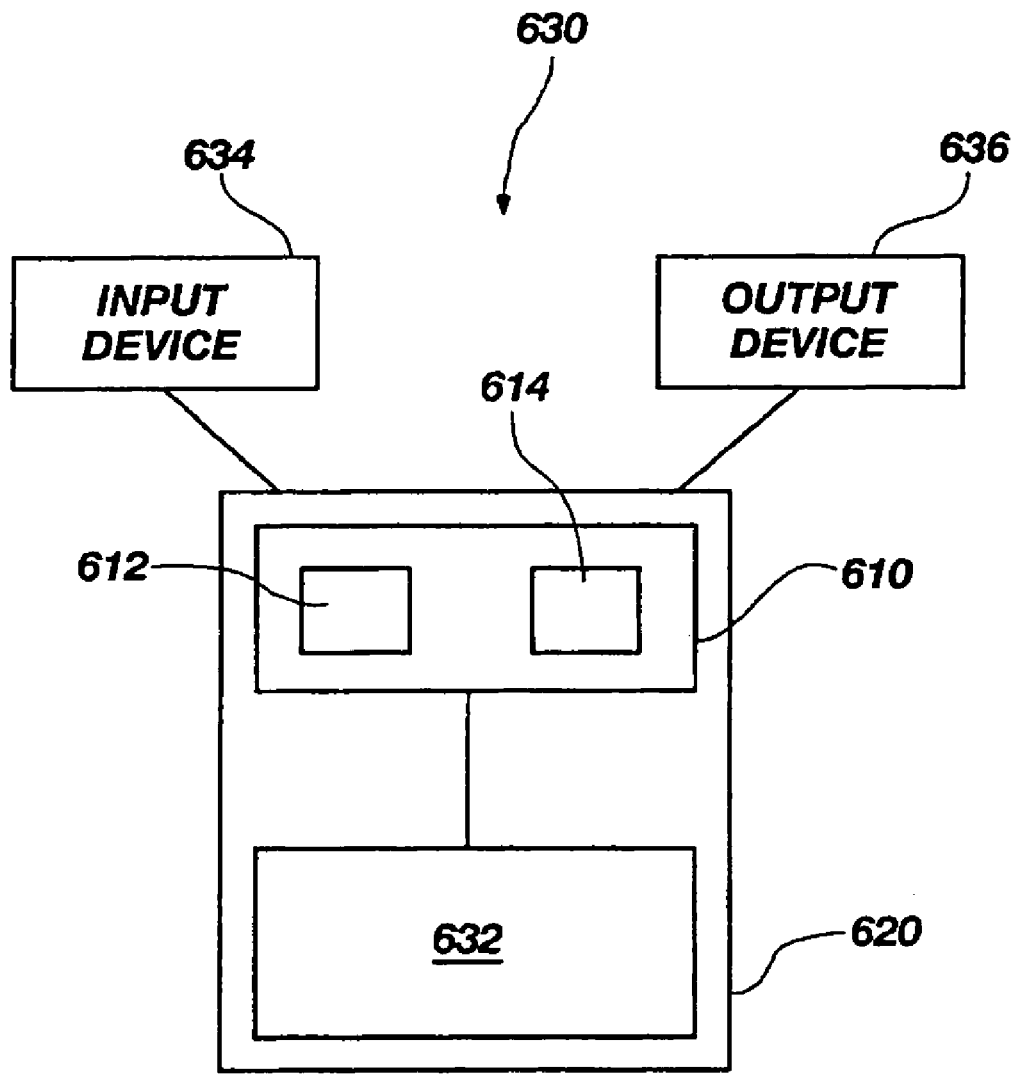
FIG. 7 is a block diagram of a system according to the present invention.

It is further noted that the above-described embodiments of an interposer or a semiconductor device according to the present invention may be utilized in a computer or electronic environment. For example, FIG. 7 shows a schematic block diagram of system 630 according to the present invention. Semiconductor device 610, including at least one interposer 612 according to the present invention and at least one semiconductor die 614, may include an electronic device 620, such as a computing device, the electronic device 620 including a processor device 632, such as a central processing unit or other logic device, operably coupled thereto. Further, processor device 632 may also be coupled with one or more appropriate input devices 634 (e.g., mouse, push-button, touch screen, communication interface, hard drive, etc.) and one or more output devices 636 (e.g., a display, printer, communication interface, hard drive, etc.) within system 630. It is also noted that the semiconductor device 610 may be utilized in various computing environments, systems, and devices, such as, for example, cell phones, personal data assistants (PDAs), and other similar electronic devices.

While the present invention has been disclosed in terms of certain preferred embodiments, those of ordinary skill in the art will recognize and appreciate that the invention is not so limited. Additions, deletions, and modifications to the disclosed embodiments may be effected without departing from the scope of the invention as claimed herein. Similarly, features from one embodiment may be combined with those of another while remaining within the scope of the invention.

What is claimed is:

1. A method of forming a semiconductor die interposer including at least one passive element, the method comprising:
    forming at least one conductive trace from an electrically conductive layer on a substrate including at least one dielectric layer and at least one electrically conductive layer at least partially superimposed with respect to one another, the at least one conductive trace having at least a portion thereof positioned in an overlapping relationship with an intended position of at least a portion of at least one recess;
    forming the at least one recess at least partially within the at least one dielectric layer and the at least one electrically conductive layer by removing a portion of the at least one dielectric layer and a portion of the at least one conductive trace at the intended position of the at least a portion of the at least one recess to define at least a portion of a side wall of the at least one recess with a portion of the at least one conductive trace;
    selecting at least one dimension of the at least one recess for at least one passive element formed therein to exhibit an intended magnitude of at least one electrical property;
    depositing conductive material at least partially within the at least one recess; and
    forming the at least one passive element from the conductive material wherein the at least one conductive trace is configured for electrically communicating with at least a portion of the at least one passive element.

2. The method of claim 1, wherein forming the at least one recess within a portion of the at least one dielectric layer comprises at least one of etching the at least one dielectric layer, drilling the at least one dielectric layer, exposing the at least one dielectric layer to a laser beam, and punching the at least one dielectric layer.

3. The method of claim 1, wherein depositing the conductive material at least partially within the at least one recess comprises screen printing conductive material at least partially within the at least one recess.

4. The method of claim 3, further comprising vibrating the conductive material disposed at least partially within the at least one recess.

5. The method of claim 4, wherein vibrating the conductive material disposed at least partially within the at least one recess comprises vibrating the at least one dielectric layer.

6. The method of claim 5, wherein vibrating the conductive material disposed at least partially within the at least one recess comprises vibrating the at least one dielectric layer during screen printing the conductive material at least partially within the at least one recess.

7. The method of claim 3, wherein screen printing the conductive material at least partially within the at least one recess comprises:
    disposing a stencil adjacent to a surface of the semiconductor die interposer;
    substantially aligning at least one aperture formed in the stencil with the at least one recess;
    providing a quantity of conductive paste onto an upper surface of the stencil; and
    moving at least a portion of the quantity of conductive paste at least partially into the at least one recess.

8. The method of claim 7, wherein moving the at least a portion of the quantity of conductive paste at least partially into the at least one recess comprises moving a squeegee blade in contact with the upper surface of the stencil across the at least one aperture formed therein.

9. The method of claim 7, further comprising:
    removing the stencil from adjacent the surface of the semiconductor die interposer; and
    removing a portion of the quantity of conductive paste extending above the surface of the semiconductor die interposer.

10. The method of claim 9, wherein removing the portion of the quality of conductive paste which extends above the surface of the semiconductor die interposer comprises moving a squeegee assembly along the surface of the semiconductor die interposer.

11. The method of claim 10, further comprising vibrating the conductive material disposed at least partially within the at least one recess.

12. The method of claim 11, wherein vibrating the conductive material disposed at least partially within the at least one recess comprises vibrating the squeegee assembly.

13. The method of claim 3, wherein screen printing the conductive material at least partially within the at least one recess comprises:
    providing a quantity of conductive paste onto a surface of the semiconductor die interposer;
    moving at least some of the quantity of conductive paste at least partially into the at least one recess.

14. The method of claim 1, wherein depositing the conductive material at least partially within the at least one recess comprises injecting the conductive material at least partially within the at least one recess.

15. The method of claim 14, further comprising vibrating the conductive material injected at least partially within the at least one recess.

16. The method of claim 14, wherein injecting the conductive material at least partially within the at least one recess comprises filling only a portion of the at least one recess with the conductive material.

17. The method of claim 1, wherein depositing the conductive material at least partially within the at least one recess comprises depositing the conductive material at least partially within the at least one recess by way of maskless mesoscale materials deposition.

18. The method of claim 1, further comprising vibrating the conductive material deposited at least partially within the at least one recess.

19. The method of claim 18, wherein communicating vibrational energy to the conductive material deposited at least partially within the at least one recess comprises vibrating the at least one dielectric layer.

20. The method of claim 19, wherein vibrating the conductive material deposited at least partially within the at least one recess comprises vibrating the at least one dielectric layer during depositing the conductive material at least partially within the at least one recess.

21. The method of claim 1, wherein providing the substrate including the at least one electrically dielectric layer comprises providing the substrate including a plurality of dielectric layers.

22. The method of claim 21, wherein providing the substrate including the at least one electrically conductive layer comprises providing the substrate including a plurality of conductive layers.

23. The method of claim 21, further comprising:
    forming the at least one recess at least partially within at least some of the plurality of dielectric layers by removing a respective portion thereof; and screen printing the conductive material at least partially within the at least one recess within the at least some of the plurality of dielectric layers.

24. The method of claim 21, wherein the at least one passive element is positioned within more than one of the plurality of dielectric layers.

25. The method of claim 21, further comprising forming at least one conductive via extending from the at least one passive element.

26. The method of claim 21, wherein selecting the at least one dimension of the at least one recess for the at least one passive element formed therein to exhibit the intended magnitude of the at least one electrical property comprises selecting at least one dimension of the at least one recess for the at least one passive element formed therein to exhibit the intended magnitude, respectively, of more than one electrical property.

27. The method of claim 1, wherein forming the at least one passive element from the conductive material comprises forming at least one of a resistor, a capacitor, and an inductor.

28. The method of claim 27, wherein the at least one electrical property comprises at least one of resistance, capacitance, and inductance.

29. The method of claim 1, wherein:
forming the at least one recess comprises forming two adjacent recesses; and
the two adjacent recesses are separated by a distance of about 20 µm.

30. The method of claim 1, wherein depositing the conductive material at least partially within the at least one recess comprises filling only a portion of the at least one recess with the conductive material.

* * * * *

UNITED STATES PATENT AND TRADEMARK OFFICE
CERTIFICATE OF CORRECTION

PATENT NO. : 7,494,889 B2 Page 1 of 1
APPLICATION NO. : 10/923437
DATED : February 24, 2009
INVENTOR(S) : Lee It is certified that error appears in the above-identified patent and that said Letters Patent is hereby corrected as shown below:

In column 18, line 10, in Claim 10, delete "quality" and insert -- quantity --, therefor.

In column 18, line 57, in Claim 21, after "one" delete "electrically".

Signed and Sealed this

Fifth Day of May, 2009

JOHN DOLL
*Acting Director of the United States Patent and Trademark Office*